United States Patent
Lampen et al.

(10) Patent No.: US 6,175,287 B1
(45) Date of Patent: Jan. 16, 2001

(54) DIRECT BACKSIDE INTERCONNECT FOR MULTIPLE CHIP ASSEMBLIES

(75) Inventors: James L. Lampen, Medway; Paul Setzco, Wellesley; Thomas E. Kazior, Sudbury; Michael G. Kizner, Dracut; John P. Wendler, Jr., Stow, all of MA (US)

(73) Assignee: Raytheon Company, Lexington, MA (US)

( * ) Notice: Under 35 U.S.C. 154(b), the term of this patent shall be extended for 0 days.

(21) Appl. No.: 08/864,533

(22) Filed: May 28, 1997

(51) Int. Cl.[7] ................................................. H01L 23/02
(52) U.S. Cl. ......................... 333/247; 257/728; 361/783
(58) Field of Search .................................... 333/247, 246; 257/728; 174/262, 266; 361/783

(56) References Cited

U.S. PATENT DOCUMENTS

| 5,352,998 | * | 10/1994 | Tanino | 257/728 X |
| 5,406,125 | * | 4/1995 | Johnson et al. | 333/247 X |
| 5,635,762 | * | 6/1997 | Gamand | 333/246 X |
| 5,694,300 | * | 12/1997 | Mattei et al. | 257/728 |
| 5,832,598 | * | 11/1998 | Greenman et al. | 333/247 X |
| 5,949,140 | * | 9/1999 | Nishi et al. | 257/728 |

FOREIGN PATENT DOCUMENTS

| 310203 | * | 12/1988 | (JP) | 333/247 |

* cited by examiner

Primary Examiner—Benny Lee
(74) Attorney, Agent, or Firm—Fish & Richardson P.C.

(57) ABSTRACT

A plurality of integrated circuits, such as microwave monolithic integrated circuits (MMICs), is supported upon a common carrier substrate having transmission lines for interconnection of signals between terminals of any one of the MMICs and among terminals of the plurality of MMICs. Circuit terminals at the front sides of the respective MMICs are connected electrically by vias to the back sides of the respective MMICs to be adjacent conductive components of the transmission lines. Electrically conductive bumps of metal or epoxy serve to connect the vias to the conductive components of the transmission lines, and to connect also metallized regions of the MMICs to metallized regions of the substrate.

20 Claims, 4 Drawing Sheets

DIRECT BACKSIDE INTERCONNECT FOR MULTIPLE CHIP ASSEMBLIES

BACKGROUND OF THE INVENTION

This invention relates to the interconnection of signal lines and power lines among circuit chips such as monolithic microwave integrated circuits (MMICS) and electromechanical circuits supported on a common substrate and, more particularly, to an arrangement of vias passing through the circuit chip and normal to a surface of the substrate permitting the use of multiple bumps for batch processing of connections among components of plural chips such as MMICs in a multiple chip assembly (MCA).

In recent years, advances in the performance and ease of manufacture of gallium arsenide (GaAs) devices, MMICs, and MCAs have resulted in their utilization in numerous military and commercial systems. Essential to the utilization of this technology for construction of an MCA is the ability to form, repetitively and accurately, interconnects to MMIC chips and a common substrate which supports the chips. It has been the practice in the construction of an MCA to form RF (radio frequency) and dc (direct current) interconnects and control lines by wire or ribbon bonds.

A problem arises in that, at microwave and especially at millimeter-wave frequencies, bond wires in MCAs introduce a variable high series reactance and conductor loss. Such a wire bond may serve as a source of radiation and introduce increased electromagnetic coupling among components of the MCAs, with a resultant diminution in isolation among the components and possible occurrence of oscillations in circuits having high-gain blocks. This handicap becomes particularly noticeable with increasing frequency. Such degradation of performance is of particular importance at millimeter-wave frequencies.

SUMMARY OF THE INVENTION

The aforementioned problem is overcome and other advantages are provided by a form of interconnect which, in accordance with the invention, is implemented by a direct backside interconnect technology (DBIT) whereby a common substrate which supports the chips of an MCA is employed for interconnections among the chips by use of a set of vias passing through respective ones of the chips to communicate with the substrate. Chips of particular interest herein are integrated circuit chips (ICs) such as logic and amplifier circuit chips, chips having both electric circuit components and mechanical components, and MMICs. The vias pass through individual ones of the respective chips and are oriented normally to a surface of the substrate. The vias are arranged in accordance with matching arrangements of conductive strips on the substrate to permit use of multiple electrically conductive bumps, of substantially uniform size, for effecting electrical and physical interconnection by the vias to numerous circuit points within the various chips and corresponding terminals of stripline transmission lines within the common substrate. Additional vias may be employed for enhanced grounding of a chip by connection of a ground plate of the chip with a corresponding ground plate of the common substrate. Such additional vias may be employed also for isolation of signal lines and inhibition of oscillations. A ground plane on a bottom surface of a chip may be physically secured to a facing corresponding ground plane on a top surface of the substrate by a continuous layer of electrically conductive material, such as solder, or by a set of additional bumps.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element but may not be referenced in the description for all figures.

DETAILED DESCRIPTION OF THE INVENTION

The invention is applicable to the interconnection of various types of chips upon a common substrate, wherein an individual chip may comprise a logic circuit, an electromechanical device such as a transmission line having a component movable by an actuator for tuning the line, or a MMIC, by way of example. In the ensuing description, MMIC chips will be employed, by way of example, in a preferred embodiment of the invention, it being understood that the description applies also to use of the other forms of the chips.

Figure 1:
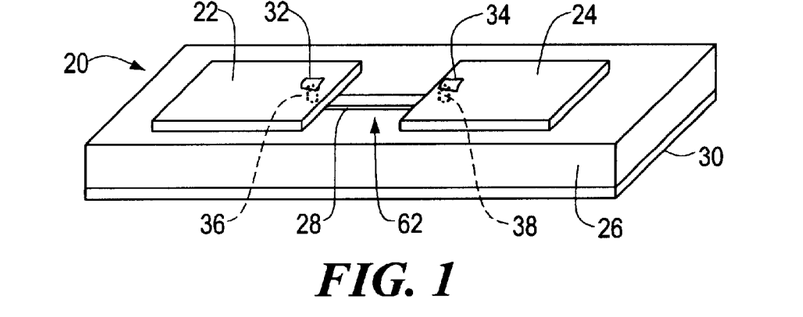
FIG. 1 is a stylized perspective view of two MMICs mounted on a common carrier substrate and being interconnected by a transmission line disposed on a front side of the substrate, the transmission line being in the form of microstrip wherein conductive vias extend through each MMIC for contacting the transmission line.
Figure 2:
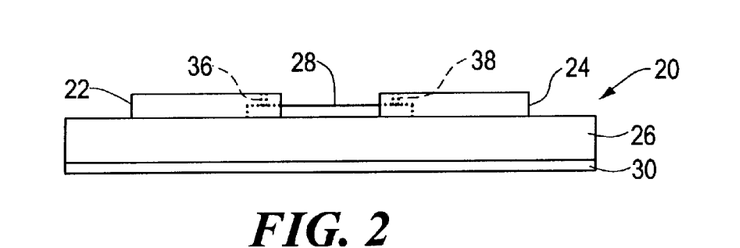
FIG. 2 is a side view of the microwave structure of FIG. 1.

With reference to FIGS. 1 and 2, a microwave structure 20 has two MMICs 22 and 24 mounted on a common carrier substrate 26. The substrate 26 is provided with metallization on a front side thereof in the form of an electrically conductive strip 28, and a metallized region serving as a ground plane 30 on the backside of the substrate 26. The substrate 26 is constructed typically of a ceramic such as alumina or beryllia, or of a semiconductor material, such as gallium arsenide, which serves as a spacer between the conductive strip 28 and the ground plane 30 to form a microstrip transmission line 62 for communicating signals between the MMICs 22 and 24. Details in the construction of the circuitry of the MMICs 22 and 24 are omitted from the figures to simplify the drawing. However, a terminal pad 32 of the MMIC 22 and a terminal pad 34 of the MMIC 24 are shown in FIG. 1, by way of example, for making contact with the respective electric circuits.

The pads 32 and 34 are located in the front sides of the MMICs 22 and 24, respectively, while the conductive strip 28 of the microstrip transmission line makes contact with the backsides of the MMICs 22 and 24. In accordance with the invention, connection of the respective pads 32 and 34 to the conductive strip 28 is made, respectively, by vias 36 and 38 which begin at pads 32 and 34, respectively, and extend through the respective MMICs 22 and 24 to contact the conductive strip 28. The MMICs may be constructed of gallium arsenide or other suitable semiconductor material and may contain additional terminals, not shown, which may be interconnected by additional transmission lines, such as the aforementioned microstrip, to enable communication of electric signals between the two MMICs 22 and 24. By way of example in the construction of each of the vias 36 and 38, each via, in the preferred embodiment of the invention, is formed as a plated through-hole resulting in a hollow tubular configuration of each of the vias 36 and 38. This construction is advantageous for resisting thermal stresses so as to inhibit any fracture of the MMICs 22 and 24 in the presence of changing temperature.

Figure 3:
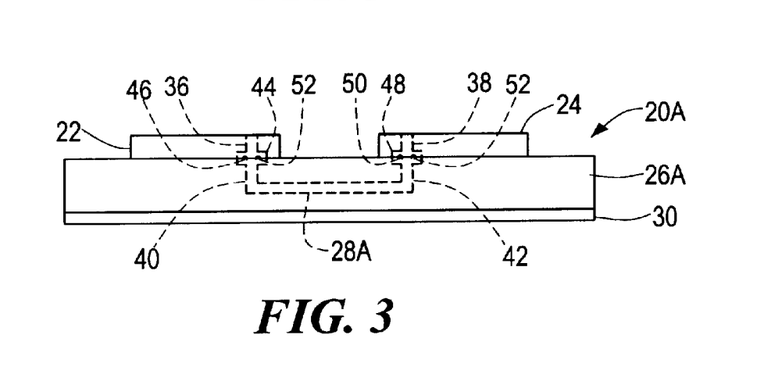
FIG. 3 is a side view, similar to that of FIG. 2, but describing an alternative embodiment of the microwave structure wherein the transmission line is buried as a layer within a multiple layer substrate.

FIG. 3 shows a microwave structure 20A having an embodiment which is alternative to that of the structure 20 of FIG. 1. In FIG. 3, the conductive strip has been lowered, as shown at 28A, so as to be buried within a substrate 26A, the substrate 26A having the form of a multiple layer substrate. The ground plane 30 is present also at the bottom side of the substrate 26A. In order to make contact by the vias 36 and 38 to the conductive strip 28A, additional vias 40 and 42 are provided within the substrate 26A for connecting ends of the strip 28A, respectively, to the vias 36 and 38. This connection is made with the aid of terminal pads 44, 46, 48, and 50 wherein the pad 44 is disposed at a bottom end of the via 36, the pad 46 is disposed at a top end of the via 40, the pad 48 is disposed at a bottom end of the via 38, and the pad 50 is disposed at a top end of the via 42. The pad 44 which is formed within the back side of the MMIC 22 is in registration with the pad 46 formed within the top side of the substrate 26A. The pad 48 formed within the back side of the MMIC 24 is in registration with the pad 50 formed in the front side of the substrate 26A.

Figure 7:
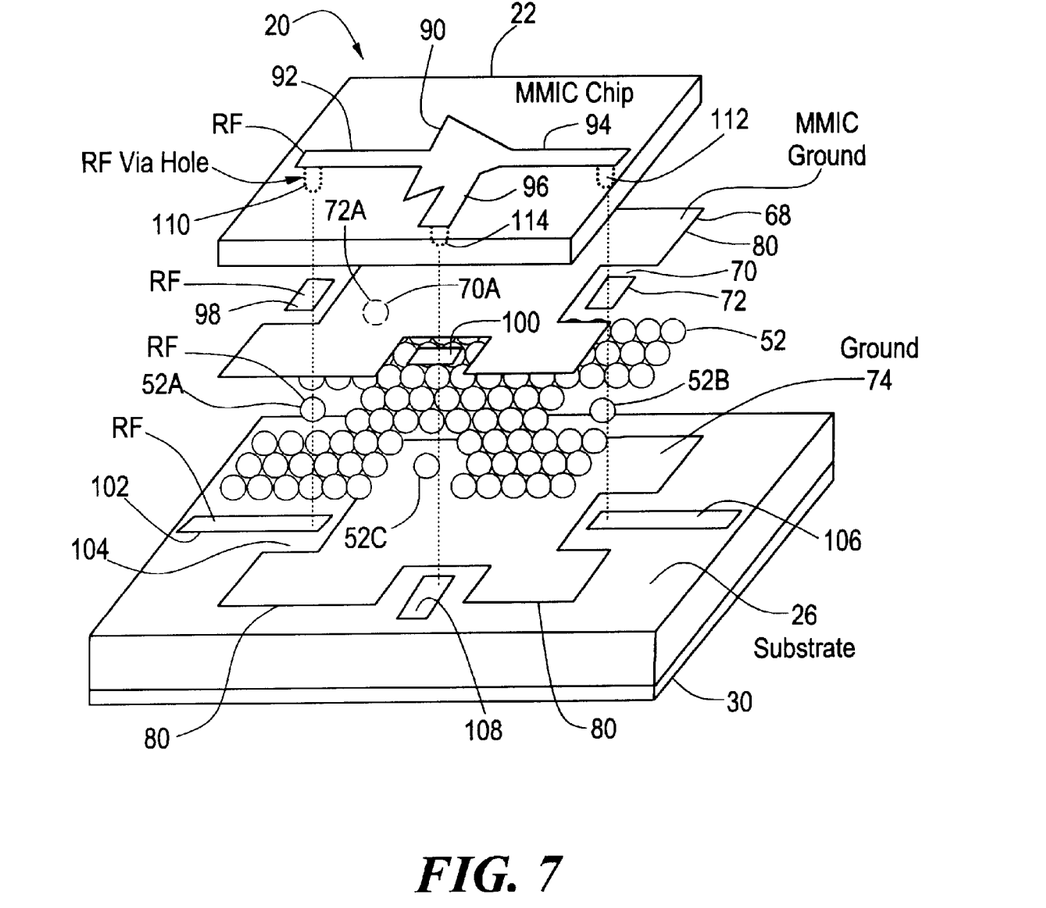
FIG. 7 is a stylized exploded view showing the connection of a single MMIC to a substrate by means of conductive connecting bumps.

In accordance with a feature of the invention, bumps 52 of electrically conductive metal or electrically conductive epoxy, as will be described further with reference to the description of FIG. 7, are employed in attaining the electrical and physical connection between the opposed pads 44 and 46 and the opposed pads 48 and 50. Similarly, such bumps are used, with reference to FIG. 2, in connecting the bottom ends of the vias 36 and 38 to the conductive strip 28, these bumps having been deleted in FIG. 2 to simplify the drawing.

Figure 4:
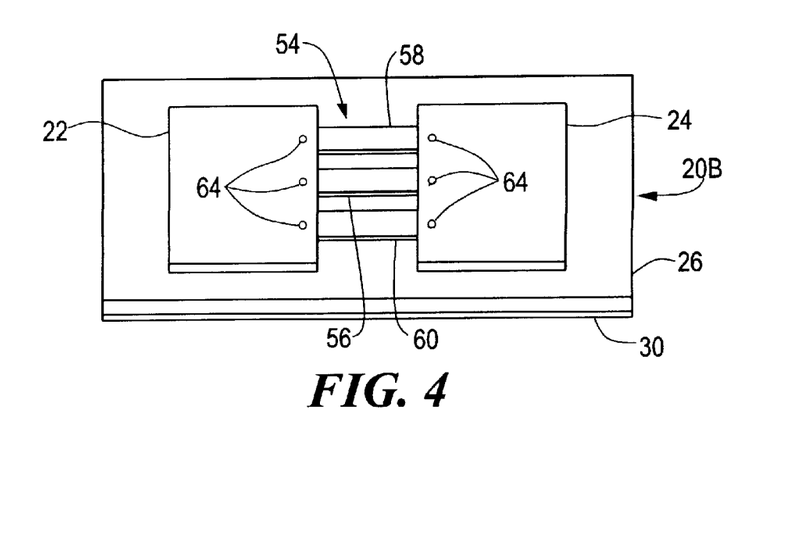
FIG. 4 is a stylized view of two MMICs mounted on a common carrier substrate wherein the transmission line is a coplanar waveguide.

With reference to FIG. 4, there is shown a microwave structure 20B having an embodiment which is an alternative to the embodiment of the invention of FIG. 1. In FIG. 4, the MMICs 22 and 24 are supported by the substrate 26, and are interconnected by a transmission line 54 having the form of a coplanar waveguide. The transmission line 54 includes a center conductive strip 56 located between two metallic regions 58 and 60 spaced apart from the center conductive strip 56. This contrasts with the transmission line 62 of FIG. 1 wherein the conductive strip 28 and the ground plane 30 produce the microstrip configuration of transmission line. Vias 64 in the MMICs 22 and 24 extend from their respective front sides through the MMICs 22 and 24 to make electrical contact between circuit components of the MMICs 22 and 24 and the coplanar transmission line 54. The ground plane 30 is shown in FIG. 4 and serves to ground and to shield various components of the circuitry of the MMICs 22 and 24. The ground plane 30 is not required for operation of the coplanar transmission line 54. The coplanar transmission line 54 is operative with or without the ground plane 30.

Figure 5:
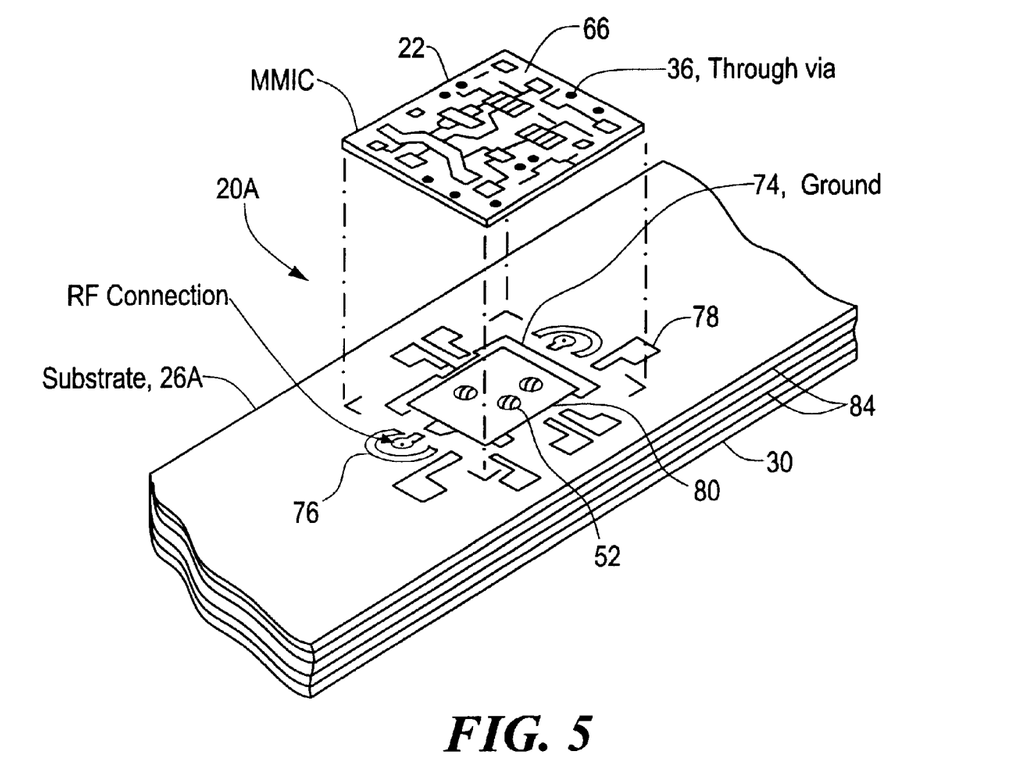
FIG. 5 is a stylized exploded view of a portion of the microwave structure wherein the MMIC is shown displaced from the substrate to disclose metallization on a front side of the substrate, the figure showing also a connection with circuit terminals on a front side of the MMIC by means of a via extending through the MMIC.
Figure 6:
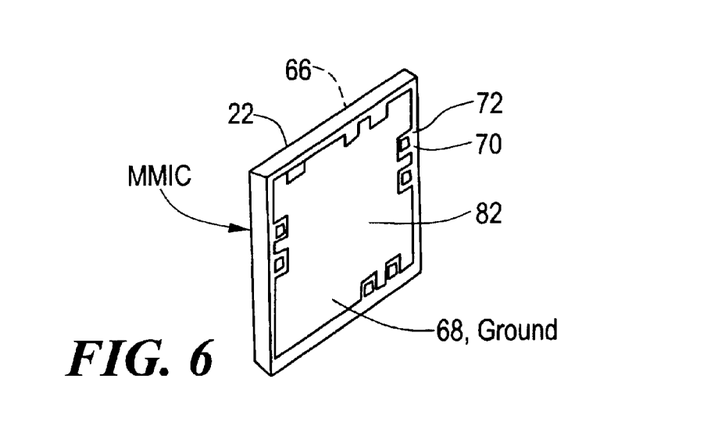
FIG. 6 is a stylized perspective view showing metallization on a backside of the MMIC.

In FIGS. 5 and 6, circuit components 66 are shown on the front side of the MMIC 22, and in FIG. 6, the MMIC 22 has metallization on the back side to form a ground plane 68. In the patterning of the metallization of the backside of the MMIC 22, edge regions of the metallization have been deleted, as at the deleted region 70, to form a pad 72 as shown in FIG. 6. The pad 72 is electrically insulated from the rest of the backside metallization for passage of electrical signals via the pad 72. A pad, such as the pad 72, may serve, alternatively, for passage of electric power for operation of the MMIC 22. The front side of the substrate 26A has metallization which is patterned to form a ground plane 74 and pads, such as the pads 76 and 78 which serve, respectively, for communication of an electrical signal and power for operation of the MMIC 22 as shown in FIG. 5.

By way of example, as shown in FIG. 5, the pad 76 is configured with inner and outer portions for communication of an RF (radio frequency) signal in the manner of transmission by a coaxial transmission line. A relatively large central region 80, formed within the metallization on the front side of the substrate 26A, serves as a site for attachment of the MMIC 22 with the aid of the electrically conductive bumps 52 which are disposed between the central region 80 of the substrate 26A and a corresponding central region 82 (see FIG. 6) of the back side metallization of the MMIC 22. Such attachment between the central regions 80 and 82 may be accomplished, alternatively, by a film or layer of electrically and thermally conductive material as will be described hereinafter in a further embodiment of the invention. The teaching of FIGS. 5 and 6 applies to a microwave structure employing either the substrate 26 or the substrate 26A, the substrate 26A being shown in FIG. 5 by way of example with its multiple layers 84. Also shown in FIG. 5 is the ground plane 30 located on the back side of the substrate 26A.

With respect to the bumps 52, three of these bumps are shown, by way of example, and any convenient number of these bumps may be employed for securing the MMIC 22 to the substrate 26A. The bumps 52 located within the central regions 80 and 82 may contact each other or may be spaced apart from each other as may be convenient in the fabrication of the microwave structure 20A. In the case wherein the bumps 52 located within the central regions 80 and 82 contact each other, these bumps may fuse together to form a layer of solder (or other electrically conductive material) during reflow of the solder at an elevated temperature employed in construction of an MCA. Additional ones of the bumps 52 (not shown in FIGS. 5 and 6) are disposed at the locations of the various pads, such as the pads 76 and 78 to make for a secure electrical connection for the transmission of signals and power. Such additional bumps 52, as will be described with reference to FIG. 7, are spaced apart from the bumps 52 at the central regions 80 and 82, so as to insure insulation of the electrical paths by which signals and power are propagated.

The pads of the substrate 26A, such as the pads 76 and 78, are aligned with corresponding pads (omitted to simplify the drawing of FIG. 6) so as to permit emplacement of the respective bumps 52 to accomplish the physical and electrical connection. It is noted that the bumps 52 are also thermally conductive so as to provide a path for flow of heat from the MMIC 22 to the ground plane 30, thereby to facilitate a cooling of the MMIC 22 by withdrawal of heat generated therein. The withdrawal of heat is facilitated further by use of additional vias 86 as will be described with reference to FIG. 8, which aid on conduction of heat between metallizations on the front side and the back side of either one of the substrates 26 and 26A, the substrate 26 being shown, by way of example in FIG. 8. Also, as will be described with reference to FIG. 8, additional vias such as a via 88 may be employed for thermal conduction between front-side and back-side metallizations of the MMIC 22, as well as for enhanced electrical grounding.

In FIG. 7, there is shown an exploded view of a region of the microwave structure 20 including the MMIC 22, the substrate 26, and the metallizations on the front and back sides of the MMIC 22 and of the substrate 26. By way of example, the MMIC 22 is provided with an amplifier 90 (indicated diagrammatically) disposed on the front side of the MMIC 22. An input terminal strip 92 and an output terminal strip 94 connect respectively with input and output terminals of the amplifier 90. A further terminal strip 96 provides direct power for operation of the amplifier 90. Also shown in FIG. 7 is the ground plane 68 (previously described with reference to FIG. 6) located on the back side of the MMIC 22, including the terminal pad 72. The pad 72 is shown spaced apart from the central region 80 of the ground plane 68 by the region 70 wherein the metallization is omitted. The region 70 of omitted metallization has a generally U-shape configuration (in FIG. 7) which may be described also as a partial annulus. A full annular configuration is provided, by way of example, at 70A by forming a pad 72A. Two additional terminal pads 98 and 100 are also provided within the ground plane 68 and separated therefrom by regions in which the metallization has been omitted. The ground plane 74 (previously described in FIG. 5) includes a terminal strip 102 spaced apart from the central region 80 by a region 104 of omitted metallization, and two further terminal strips 106 and 108 which are spaced apart, similarly, from the central region 80 by regions of omitted metallization.

Electrical contact of the terminal strips 92, 94, and 96 of the MMIC 22 to corresponding terminal strips 102, 106, and 108 of the substrate 26 are accomplished with the aid of vias 110, 112, and 114, respectively, disposed within the chip of the MMIC 22. The via 110 extends vertically through the chip from the front side to the back side of the MMIC 22, and makes contact with pad 98 at the back side of the MMIC 22. A multiplicity of the bumps 52 is disposed between the ground plane 68 of the MMIC 22 and the ground plane 74 of the substrate 26 for making electrical connection between metallic regions of the ground planes 68 and 74. One of the bumps, designated as bump 52A is spaced apart from and electrically insulated from the other ones of the bumps 52, and is located in alignment with the pad 98 and the terminal strip 102 for providing electrical connection between the pad 98 and the strip 102. Thereby, there is a direct electrical and thermal connection between the terminal strip 92 and the terminal strip 102, which connection is made by means of the via 110, the pad 98, and the bump 52A.

Two other bumps, designated 52B and 52C, are also spaced apart from the remaining ones of the bumps 52 and serve to make connections with respect to the pads 72 and 100, respectively. The bump 52B provides electrical connection between the pad 72 and the terminal strip 106, and the bump 52C provides electrical connection between the pad 100 and the terminal strip 108. The via 112 makes electrical connection between the terminal strip 94 and the pad 72, and the via 114 makes electrical connection between the terminal strip 96 and the pad 100. These additional pads provide for electrical and thermal interconnection between terminal points on the MMIC 22 and terminal points on the substrate 26. Accordingly, electrical and thermal connection between the strip 94 and the strip 106 is made by means of the via 112, the pad 72, and the bump 52B. Similarly, electrical and thermal connection between the strip 96 and the strip 108 is made by means of the via 114, the pad 100, and the bump 52C.

By way of example in the utilization of the circuitry of FIG. 7, an RF signal entering via the terminal strip 102 on the substrate 26 is conducted upwardly via the pad 98 to the input terminal strip 92 to be amplified by the amplifier 90. The signal outputted by the amplifier 90, appearing at the output terminal strip 94, is coupled via the pad 72 to the terminal strip 106 on the substrate 26. The terminal strip 106 may provide the function of the conductive strip 28 for the coupling of an RF signal to a further MMIC such as the MMIC 24 (shown in FIG. 1, but deleted in FIG. 7). The MMIC 22 may be provided with complex or simple circuits, as may be required for a specific application. In its simplest form, the MMIC 22 may be a single conductive strip, without amplification or other signal processing, to simply provide the function of a jumper strip whereby a signal propagating at some point on the substrate 26 is passed over to another circuit point on the substrate 26.

In accordance with a feature of the invention, thermal conductive paths can be provided for conduction of heat between top and bottom surfaces of the substrate 26 as well is between top and bottom surfaces of the MMIC 22. Such thermal connections are also operative to provide for improved grounding between ground points on the MMIC 22 and the ground plane 30 on the back side of the substrate 26. These additional electrical and thermally conductive pads are disclosed in further detail in FIG. 8.

Figure 8:
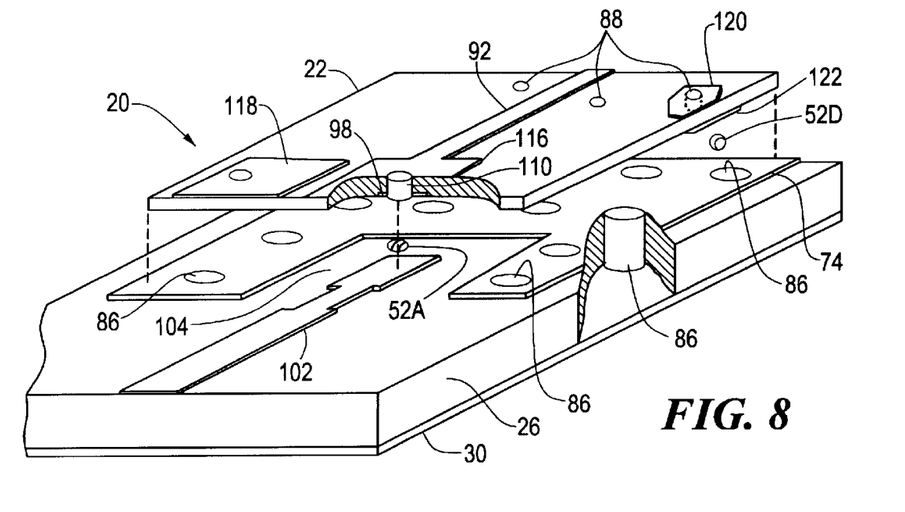
FIG. 8 is a further stylized exploded view of an MMIC and its substrate showing vias extending between front and back metallized regions of the substrate and of an MMIC chip.

With reference to FIG. 8, there is shown a portion of the MMIC 22 disposed above a portion of the substrate 26. The terminal strip 92 of the MMIC 22 is shown connected at a pad 116 to the via 110, the via 110 being connected via the pad 98 to the bump 52A and, via the bump 52A, to the terminal strip 102. Additional pads 118 and 120 are shown in the MMIC 22, by way of example, wherein the pad 118 and 120 are disposed on the front side of the MMIC 22 while yet a further pad 122 is disposed on the back side of the MMIC 22. The via 88 provides for both electrical and thermal conduction between the pad 120 and the pad 122 at the MMIC 22. Individual ones of the vias 86 provide electrical and thermal conduction between the ground plane 74 and the ground plane 30 of the substrate 26. A portion of the substrate 26 is cut away to facilitate a showing of one of the vias 86.

Numerous ones of the vias 86 may be provided for improved grounding and cooling of the microwave structure 20. In addition, numerous ones of the vias 86 may be located about a terminal strip, such as the strip 102, to aid in electrical isolation of the strip 102 from other electrically conductive circuit elements of the microwave structure 20. In similar fashion, additional vias 88 may be emplaced about the terminal strip 92, as well as about other components, (not shown) in the MMIC 22 for shielding signal and/or power lines from signals in other components of the circuitry in the microwave structure 20. Such shielding and cooling is enhanced, by means of individual ones of the bumps, such as at bump 52D shown connected between the pad 122 of the MMIC 22 and the ground plane 74 of the substrate 26. Spacing between the vias 88 in the MMICs 22 and 24, as well as spacing between the vias 86 in the substrate 26, may be on the order of one-eighth wavelength of the RF signals to be communicated via the MMICs 22 and 24 to provide the desired isolation among the signal paths and prevention of the development of resonant structures.

The foregoing interconnection by means of vias provides signal paths for logic, bias and RF signals, as well as providing for connection of power to the various circuits, and also for the establishment of ground continuity. The shielding of conductive strips, as provided by the vias 86 of the substrate 26 and the vias 88 of the MMIC 22 inhibits coupling among the various signals communicated within and between the various MMIC chips, and also prevent formation of resonant structures. During the manufacture of the microwave structure 20, the bumps 52 may be placed initially on the backside of the MMIC or on the front side of the carrier substrate after which the MMICs 22 and 24, the bumps 52, and the substrate 26 are placed in their respective relative positions for assembly of the microwave structure. This is followed by a heating of the structure to allow for reflow of the solder in the case of solder bumps, or for curing of the conductive epoxy, in the case of epoxy bumps. Thereby, the bumps 52 provide for a permanent attachment between the MMICs and the carrier substrate.

Preferably, all of the bumps 52 have an initial equal height, prior to assembly of the microwave structure 20, so as to facilitate the emplacement of the MMIC chips upon the carrier substrate in the manufacturing process. Thereby, the invention provides facilitation of manufacture through avoidance of wire bonds and their undesirable inductance and other impedance matching problems. It is noted also that this form of manufacture allows for batch processing whereby numerous MMIC chips can be secured simultaneously to a common carrier substrate. The formation of the electrically conductive paths and the configuration of the ground layers of metallization are accomplished by photolithography, the photolithography being done separately on the substrate and on the MMIC chips prior to assembly of the microwave structure. The process of manufacture is applicable to various thicknesses of wafers or MMIC chips, conventional 4 mil thick gallium arsenide wafers having been used in construction of a preferred embodiment of the invention. Thereby, the invention provides for convenience in manufacture and improved electrical and thermal characteristics of a microwave structure comprising multiple MMIC chips mounted on a common substrate.

Figure 9:
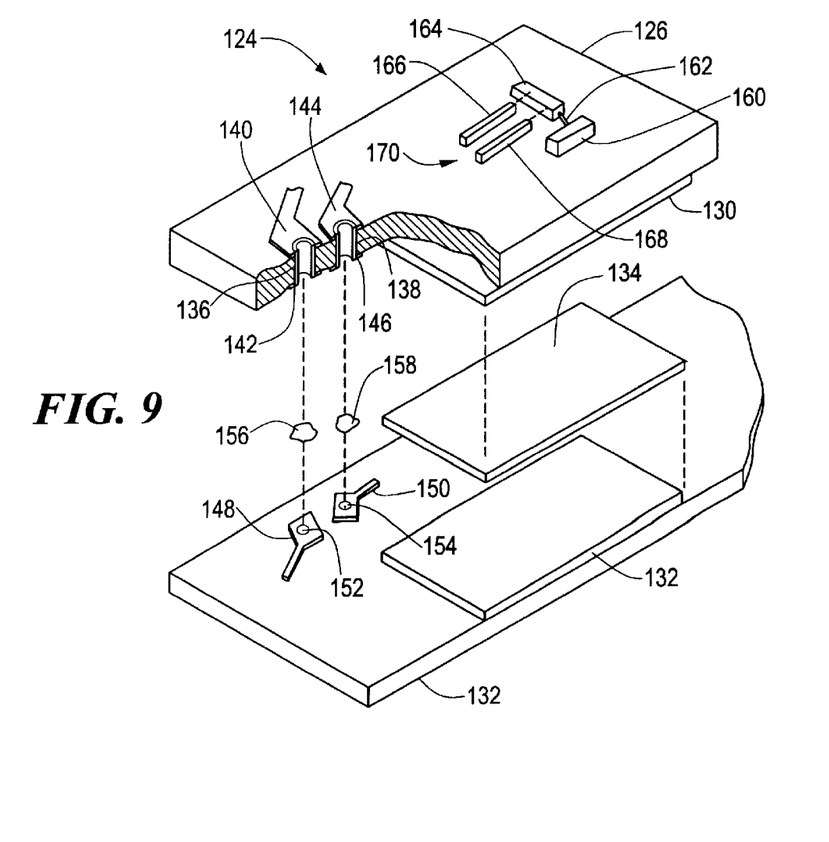
FIG. 9 shows a stylized exploded view of an alternative embodiment for mounting an integrated circuit on a substrate.

In FIG. 9, a circuit assembly 124 comprises a chip 126 supported upon a substrate 128. A ground plane 130 is disposed on a back side of the chip 126, and a ground plane 132 is disposed on a front side of the substrate 128. In accordance with a feature of this alternative embodiment of the invention, the chip 126 is secured to the substrate 128 by means of a layer 134 of electrically conductive material, such as solder, which adheres to both of the ground planes 130 and 132, thereby to secure the chip 126 to the substrate 128. Two vias 136 and 138 pass through the chip 126 from the front side thereof to the back side thereof to make electrical connections between circuit components (not shown) located on the chip 126 and the substrate 128. Such connection is made by means of pads 140 and 142 connecting with the via 136 and disposed, respectively, on the front and the back sides of the chip 126. Similarly, such electrical connection is made with pads 144 and 146 connecting with the via 138 and disposed, respectively, on the front and the back sides of the chip 126. Further pads 148 and 150 are disposed on the front side of the substrate 128 and, if desired, may also include vias 152 and 154, respectively, which connect with the pads 148 and 150 for coupling electrical signals between the pads 148 and 150 and the back side of the substrate 128. Electrical connection between the pad 142 and the pad 148 is made by means of a bump 156 of electrically conductive material, and electrical connection between the pad 146 and the pad 150 is made by a bump 158 of electrically conductive material. Thereby, with the construction of FIG. 9, the circuit assembly 124 is held together by means of the layer 134 while electrical signals are coupled between the chip 126 and the substrate 128 by means of the bumps 156 and 158, these bumps being spaced apart from each other and from the layer 134 to ensure electrical isolation of signals passing through the vias 136 and 138.

By way of example in the construction of the chip 126, the chip 126 includes both electrical circuitry and mechanical components. An electric circuit 160, which may be a logic circuit, is connected via a conductor 162 to an actuator 164. By way of further example, the mechanical components are shown as conductive elements 166 and 168 which constitute parts of an electric transmission line 170. The spacing between the conductive elements 166 and 168 is controlled by means of the actuator 164 which is coupled mechanically to one or both of the conductive elements 166 and 168. The materials used in fabricating the chip 126 and the substrate 128 may be the same as those disclosed with reference to the microwave structure of FIG. 7.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A microwave structure comprising:

an integrated circuit (IC) having the form of a chip, a carrier substrate for supporting the IC, and a multiplicity of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad;

said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate; and said substrate comprises a further ground plane located at the back side of said substrate and a plurality of electrically conductive vias interconnecting said further ground plane with said conductive layer, said conductive layer and said via of said IC and said vias of said substrate defining a continuous thermal path for conduction of heat of said IC to said further ground plane.

2. Structure according to claim 1 wherein said conductive line and said conductive layer of said substrate define a coplanar transmission line.

3. A structure according to claim 1 wherein said conductive line and said further ground plane define a microstrip transmission line.

4. A structure according to claim 1 wherein said IC is a first IC and said multiplicity of bump further defines a first multiplicity of bumps, said structure further comprising a second IC having the form of a chip and being supported by said substrate, and a second multiplicity of bumps interconnecting said second IC with said substrate.

5. A structure according to claim 4 wherein said second IC comprises a circuit terminal at a front side of said second IC, a ground plane at a back side of said second IC, and an electrically conductive via extending to the back side of said second IC from said circuit terminal at the front side of said second IC, said ground plane of said second IC being patterned with an annular aperture which defines a pad connecting with said via at the back side of said second IC, said aperture insulating said via from said ground plane at said second IC;

said conductive layer of said substrate underlies a portion of the ground plane of said second IC, and said conductive line extends toward said pad at the back side of said second IC; and said second multiplicity of bumps includes a first set of bumps and a second set of bumps of which said first set of bumps has at least one bump and said second set of bumps has a plurality of bumps, said first set of bumps of said second multiplicity of bumps joining the pad of said second IC to the conductive line of said substrate, and said second set of bumps of said second multiplicity of bumps joining the ground plane of said second IC with the conductive layer of said substrate.

6. A structure according to claim 1 wherein said via of said IC is a first via, said IC further comprising a plurality of electrically conductive vias in addition to said first via, and said plurality of vias of said IC interconnect ground points of said IC located at the front side of said IC with the ground plane at the back side of said IC.

7. A structure according to claim 1 further comprising circuitry external to said chip connecting via said substrate to said chip.

8. A structure according to claim 7 wherein said external circuitry is another IC chip.

9. A microwave structure comprising:

an integrated circuit (IC) having the form of a chip, a carrier substrate for supporting the IC, and a multiplicity of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad;

said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate;

said substrate comprises a further ground plane located at the back side of said substrate, and said conductive line and said further ground plane define a microstrip transmission line; and said substrate further comprises a plurality of electrically conductive vias interconnecting said further ground plane with said conductive layer, said via of said IC and said second set of bumps and said vias of said substrate defining a continuous thermal path for conduction of heat of said IC to said further ground plane.

10. A microwave structure comprising:

an integrated circuit (IC) having the form of a chip, a carrier substrate for supporting the IC, and a multiplicity of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad;

said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate; and the bumps from at least a part of said second set of bumps are fused together, and said IC is a MMIC.

11. A microwave structure comprising:

an integrated circuit (IC) having the form of a chip, a carrier substrate for supporting the IC, a layer of conductive connective material, and a set of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad;

said set of bumps has at least one bump, said set of bumps joins the pad of said IC to said conductive line of said substrate, and said layer of material joins the ground plane of said IC with the conductive layer of said substrate; and said substrate comprises a further ground plane located at the back side of said substrate and a plurality of electrically conductive vias interconnecting said further ground plane with said conductive layer, said conductive layer and said via of said IC and said vias of said substrate defining a continuous thermal path for conduction of heat of said IC to said further ground plane.

12. A method of constructing a structure of plural ICs supported upon a common substrate, wherein each IC has the form of a chip and comprises at least one terminal located on a front side thereof, the method comprising the steps of:

placing respective electrically conductive vias in corresponding ones of said ICs for connecting the at least one terminal to a back side of the respective ICs;

forming a conductive layer with a transmission line on the substrate;

placing electrically conductive bumps between the back sides of respective ones of said ICs and said substrate;

connecting the at least one terminal in a first of said ICs to the at least one terminal in a second of said ICs via said transmission line, said connecting step including a contacting of a via on the back side of said first IC via one of said bumps to a conductive element of said transmission line;

constructing on said substrate a further ground plane located at the back side of said substrate;

arranging a plurality of electrically conductive vias in said substrate for interconnecting said further ground plane with said conductive layer, said conductive layer and said via of any one of said ICs and said vias of said substrate defining a continuous thermal path for conduction of heat of said any one IC to said further ground plane.

13. A method according to claim 12 further comprising steps of:

placing metallized regions on facing sides of respective ones of said ICs and said substrate; and joining a first metallized region of said first IC to a metallized region of said substrate by further ones of said bumps, said further ones of said bumps being spaced apart from said one bump which connects said via to said transmission line to insure electrical insulation between said via and said metallized regions.

14. A microwave structure comprising:

an integrated circuit (IC) having the form of a chip, a carrier substrate for supporting the IC, and a multiplicity of conducive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conducive signal line, and an electrically conductive layer covering a portion of the front side of said substrate and being spaced apart from said conductive line;

said conductive layer of said substrate underlies a portion of said ground plane of said IC, and said conductive line extends toward said pad;

said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate; and the bumps from at least a part of said second set of bumps are fused together, and said IC is a chip comprising an electric circuit.

15. A microwave structure comprising:

an integrated circuit (IC) having the form of a chip, a carrier substrate for supporting the IC, and a multiplicity of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad; and said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate; and the bumps from at least a part of said second set of bumps are fused together, and said IC is a combination of electric and mechanical components.

16. A microwave structure comprising:

an integrated circuit (IC) having the form of a chip, a carrier substrate for supporting the IC, and a multiplicity of conductive connective bumps disposed between the IC and the substrate, the IC having a front side and a back side, the substrate having a front side and a back side, the back side of the IC facing the front side of the substrate;

wherein said IC comprises a circuit terminal at the front side of said IC, a ground plane at the back side of said IC, and an electrically conductive via extending to the back side of said IC from said circuit terminal at the front side of said IC, said ground plane being patterned with an annular aperture which defines a pad connecting with said via at the back side of said IC, said aperture insulating said via from said ground plane;

said substrate comprises a conductive signal line, and an electrically conductive layer covering a portion of the front side of said substrate and being spaced apart from said conductive line;

said conductive layer of said substrate underlies a portion of said ground plane of said IC, and said conductive line extends toward said pad;

said multiplicity of bumps includes a first set of bumps and a second set of bumps, said first set of bumps having at least one bump and said second set of bumps having a plurality of bumps, said first set of bumps joining the pad of said IC to said conductive line of said substrate, and said second set of bumps joining the ground plane of said IC with the conductive layer of said substrate;

said substrate comprises a further ground plane located at the back side of said substrate, and said conductive line and said further ground plane define a microstrip transmission line; and at least a portion of said conductive line is embedded in said substrate at a location between said front side and said back side of said substrate.

17. A structure according to claim 16 wherein said substrate further comprises a plurality of electrically conductive vias interconnecting said further ground plane with said conductive layer.

18. A structure comprising:

(A) an integrated circuit (IC) having the form of a chip, the IC having:
  (i) a front side;
  (ii) a back side;
  (iii) a circuit terminal disposed on the front side of said IC;
  (iv) a ground plane disposed on the back side of said IC, said ground plane having an opening therein;
  (v) an electrically conductive pad disposed on the back side of said IC, said pad being disposed in the opening, such pad being electrically insulated from the ground plane;
  (vi) an electrically conductive via extending from said circuit terminal at the front side of said IC through the IC to the pad;

(B) a microstrip transmission line carrier substrate for supporting the IC, said substrate comprising:
  (i) a dielectric member;
  (ii) a conductive signal line disposed on one side of the dielectric member;
  (iii) an electrically conductive layer disposed on said side of the dielectric member electrically isolated from the conductive signal line;
  (iv) a ground plane conductor disposed under said side of the the dielectric member, said ground plane conductor of the carrier substrate being separate from the conductive signal line by a portion of the dielectric member, said ground plane conductor of the substrate, said conductive signal line, and said separating portion of the dielectric member providing a microstrip transmission line;
  (v) an electrically conductive via passing through the dielectric member between the electrically conductive layer on said side of the dielectric member and the ground plane conductor of the substrate; and wherein (C) said conductive layer of said substrate is bonded, and thermally connected, to the ground plane of the IC; and wherein (D) the pad is electrically connected to the conductive signal line.

19. A structure comprising:

(A) an integrated circuit (IC) having the form of a chip, the IC having:
  (i) a front side;
  (ii) a back side;
  (iii) a circuit terminal disposed on the front side of said IC;
  (iv) a ground plane disposed on the back side of said IC, said ground plane having an opening therein;
  (v) an electrically conductive pad disposed on the back side of said IC, said pad being disposed in the opening, such pad being electrically insulated from the ground plane;
  (vi) an electrically conductive via extending from said circuit terminal at the front side of said IC through the IC to the pad;

(B) a microwave transmission line carrier substrate for supporting the IC, said substrate comprising:
  (i) a dielectric member;
  (ii) a conductive signal line disposed on one side of the dielectric member;
  (iii) a conductive layer separated from the conductive signal line by a portion of the dielectric member, said conductive layer, said conductive signal line, and said separating portion of the dielectric member providing a microwave transmission line;

(C) a plurality of conductive connective bumps disposed between the ground plane conductor of the IC and the carrier substrate to bond, and thermally connect, the ground plane of the IC to the carrier substrate; and wherein (D) the pad is electrically connected to the conductive signal line.

20. A structure comprising:

(A) an integrated circuit (IC) having the form of a chip, the IC having:
  (i) a front side;
  (ii) a back side;
  (iii) a circuit terminal disposed on the front side of said IC;
  (iv) a ground plane disposed on the back side of said IC, said ground plane having an opening therein;
  (v) an electrically conductive pad disposed on the back side of said IC, said pad being disposed in the opening, such pad being electrically insulated from the ground plane;

(vi) an electrically conductive via extending from said circuit terminal at the front side of said IC through the IC to the pad;

(B) a microwave transmission line carrier substrate for supporting the IC, said substrate comprising:
(i) a dielectric member;
(ii) a conductive signal line disposed on one side of the dielectric member;
(iii) a conductive layer disposed on said side of the dielectric member and separated from the conductive signal line by a portion of the dielectric member, said conductive layer, said conductive signal line, and said separating portion of the dielectric member providing a coplanar transmission line;

(C) a plurality of conductive connective bumps disposed between the ground plane conductor of the IC and the conductive layer of the substrate to bond, and thermally connect, the ground plane of the IC to the conductive layer; and wherein (D) the pad is electrically connected to the conductive signal line.

* * * * *